United States Patent
Chiu

(10) Patent No.: US 6,707,163 B2
(45) Date of Patent: Mar. 16, 2004

(54) METHOD OF ELIMINATING UNCONTROLLED VOIDS IN SHEET ADHESIVE LAYER

(75) Inventor: Anthony M. Chiu, Richardson, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 61 days.

(21) Appl. No.: 09/835,306

(22) Filed: Apr. 13, 2001

(65) Prior Publication Data

US 2002/0149106 A1 Oct. 17, 2002

(51) Int. Cl.[7] .................. H01L 23/52; H01L 23/48; H01L 29/40; H01L 21/48; H01L 21/44; H01L 21/50
(52) U.S. Cl. .................................. 257/783; 438/118
(58) Field of Search ..................... 257/783; 438/118

(56) References Cited

U.S. PATENT DOCUMENTS

| | | | | |
|---|---|---|---|---|
| 5,391,250 A | * | 2/1995 | Cheney et al. | 156/268 |
| 5,528,075 A | * | 6/1996 | Burns | 257/666 |
| 5,889,321 A | * | 3/1999 | Culnane et al. | 257/701 |
| 6,051,888 A | * | 4/2000 | Dahl | 257/778 |
| 6,107,678 A | * | 8/2000 | Shigeta et al. | 257/669 |
| 6,407,446 B2 | * | 6/2002 | Kang et al. | 257/666 |

FOREIGN PATENT DOCUMENTS

| | | | | |
|---|---|---|---|---|
| JP | 403104263 A | * | 5/1991 | 257/722 |

* cited by examiner

*Primary Examiner*—Eddie Lee
*Assistant Examiner*—Samuel A Gebremariam
(74) *Attorney, Agent, or Firm*—Lisa K. Jorgenson; William A. Munck

(57) ABSTRACT

A preformed adhesive layer for joining components within integrated circuit packaging includes venting slots for controlling the size and location of voids within an assembled integrated circuit package. Air randomly entrapped between the surfaces of the adhesive layer and adjoining components during assembly will generally release into the venting slots during subsequent assembly and/or mounting steps performed at elevated temperatures, rather than creating internal pressures causing separation of package components or releasing into the encapsulant. Die delamination and encapsulant void problems occurring during reflow or other assembly and mounting processes as a result of entrapped air are avoided.

16 Claims, 2 Drawing Sheets

METHOD OF ELIMINATING UNCONTROLLED VOIDS IN SHEET ADHESIVE LAYER

TECHNICAL FIELD OF THE INVENTION

The present invention is directed, in general, to integrated circuit packaging and, more specifically, to integrated circuit packages utilizing preformed adhesive layers for affixing package components to each other.

BACKGROUND OF THE INVENTION

Solder ball grid array (BGA) integrated circuit packages are employed to encapsulate integrated circuit die for mounting on printed circuit boards (PCBs) within various electronic devices such as telecommunications equipment. During mounting, electrical connection to packaged integrated circuits is achieved by reflowing the solder balls while in contact with corresponding connection traces on the printed circuit board onto which the package is being mounted. Optional thin mounting profiles, high package "pin" counts, and ease of mounting are features which make ball grid array packages attractive for a variety of applications including general purpose processors, digital signal processors (DSPs), and the like.

For "dense" integrated circuits having large numbers of closely spaced, small feature size devices, a metallic heat spreader is often utilized within ball grid array packages to dissipate heat generated during operation of the integrated circuit. As illustrated by the exploded view shown in FIG. 4, a ball grid array package 400 of the type described typically includes a printed circuit board substrate 401 having a cavity 402 therein, which is affixed to a metal heat spreader 403 utilizing a preformed adhesive layer 404 having a hole corresponding is size and position with cavity 402. The integrated circuit die (not shown) is mounted within the cavity, affixed to heat spreader 403, with wire bonds (not shown) connecting bonds pads in the integrated circuit die to bonding sites on the substrate 401.

A significant defect commonly found with packages of the type shown is the presence of voids between the surfaces of adhesive layer 404 and the surfaces of the components (substrate 401 and heat spreader 403 in this case) being joined by adhesive layer 404. As the components are being affixed utilizing adhesive layer 404, air is often randomly entrapped between the surfaces of the components and the surfaces of adhesive layer 404. If not removed before the adhesive layer 404 hardens, uncontrolled voids (pockets of trapped air) will be formed in the finished package between the adhesive layer 404 and adjoining components. Such voids may be removed by high vacuum and high pressure environments commonly employed in production of printed wiring boards (PWBs), but requires heavy industrial equipment.

Two problems have been found to frequently arise during assembly and mounting of the package 400 as a result of uncontrolled voids in the adhesive layer 404: die delamination and voids within the encapsulant for the package 400. Die delamination is caused by the expansion of air entrapped between the adhesive layer and adjoining components, applying an internal pressure to cause separation of the package components from the adhesive layer 404 when the packaged device is heated during fabrication of the packaged device or subsequent mounting of the packaged device in a system.

Voids in the package encapsulant are similarly caused by gradual release of entrapped air while the encapsulant is being cured (typically at temperatures of approximately 175° C.). If these voids occur at the outer surface of the encapsulant, the packaged device is naturally rejected. On occasion, however, the air bubble does not reach the surface of the encapsulant and remains inside, a "buried" void which can result in damage to the die or to the bonding wires inside the encapsulant. In both case, encapsulant voids affect manufacturing yield and long term reliability of the product.

There is, therefore, a need in the art for improving integrated circuit packages utilizing preformed adhesive layers.

SUMMARY OF THE INVENTION

To address the above-discussed deficiencies of the prior art, it is a primary object of the present invention to provide, for use in an integrated circuit package, a preformed adhesive layer for joining components within integrated circuit packaging which includes venting slots for controlling the size and location of voids within an assembled integrated circuit package. Air randomly entrapped between the surfaces of the adhesive layer and adjoining components during assembly will generally release into the venting slots during subsequent assembly and/or mounting steps performed at elevated temperatures, rather than creating internal pressures causing separation of package components or releasing into the encapsulant. Die delamination and encapsulant void problems occurring during reflow or other assembly and mounting processes as a result of entrapped air are avoided.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
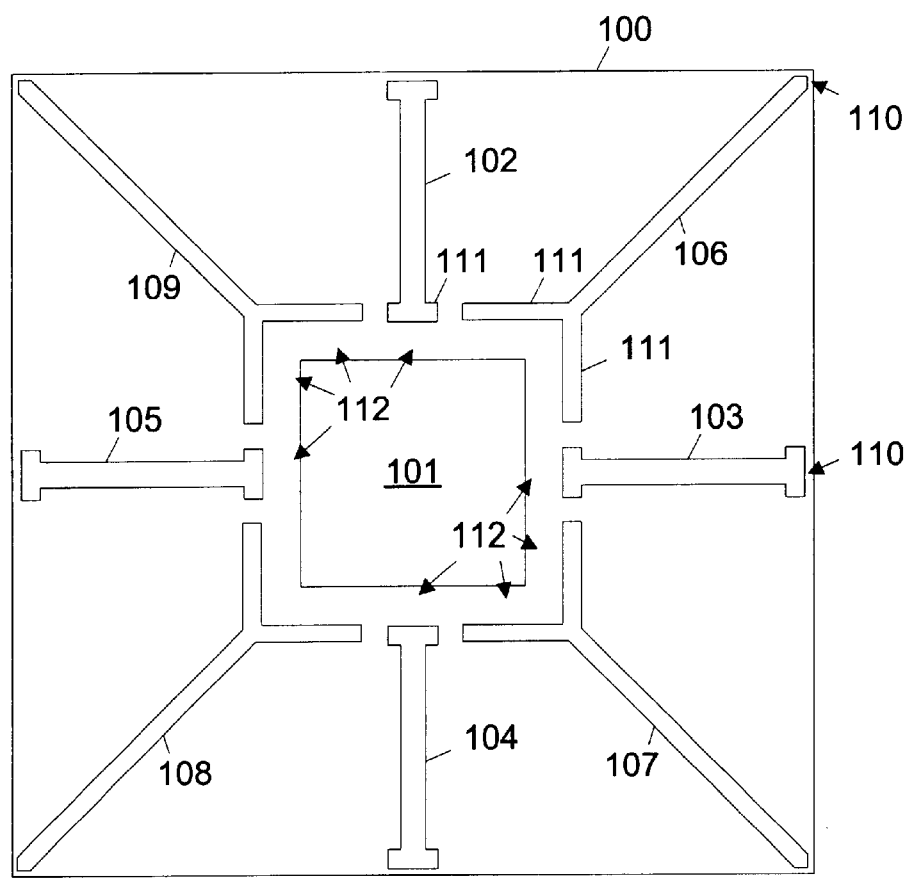
FIG. 1 is a plan view of a preformed integrated circuit packaging adhesive layer with venting slots according to one embodiment of the present invention.
Figure 2:
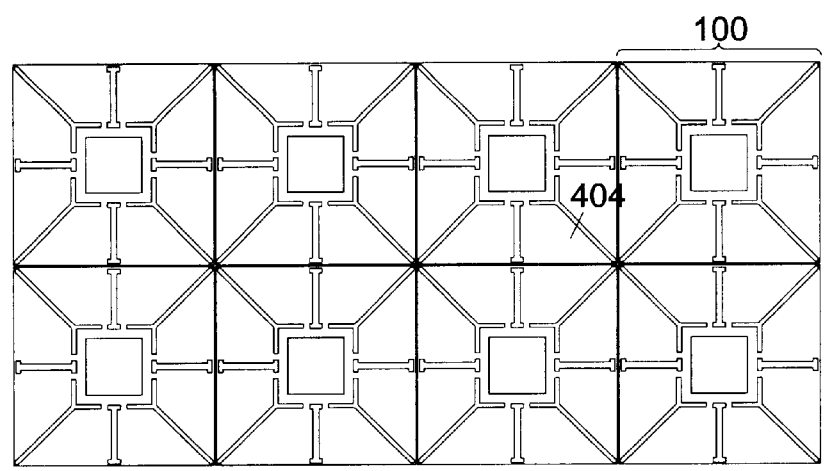
FIG. 2 is a plan view of a sheet of preformed integrated circuit packaging adhesive layers with venting slots according to one embodiment of the present invention.
Figure 3:
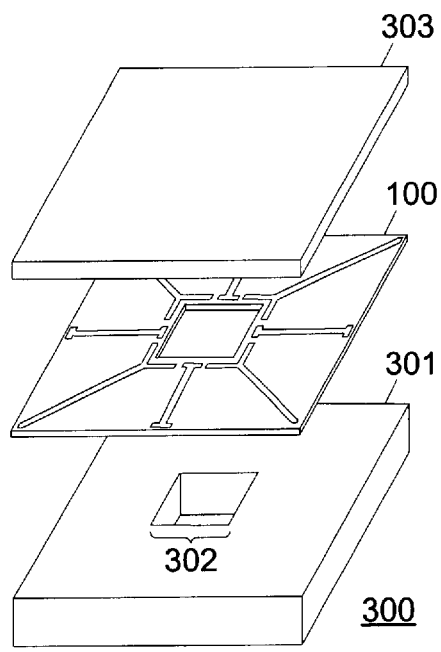
FIG. 3 depicts a portion of an integrated circuit package including a preformed adhesive layer with venting slots according to one embodiment of the present invention.

FIGS. 1 through 3, discussed below, and the various embodiment used to describe the principles of the present invention in this patent document are by way of illustration only and should not be construed in any way to limit the scope of the invention. Those skilled in the art will understand that the principles of the present invention may be implemented in any suitably arranged device.

FIG. 1 is a plan view of a preformed integrated circuit packaging adhesive layer with venting slots according to one embodiment of the present invention. Adhesive layer 100 is formed of a carrier material of the type employed to form printed circuit boards, with an epoxy or polyimide adhesive, such as a fiberglass carrier impregnated with epoxy or a polyimide carrier deposited with B-staged polyimide. Adhesive layer 100 is approximately 5 mils thick in the exemplary embodiment, and includes a cavity hole 101 in accordance with the known art.

Adhesive layer 100 in the present invention also includes venting slots 102–109 which extend through the thickness of the adhesive layer 100, and may be formed by either die punching or laser cutting of the adhesive layer 100. As illustrated, venting slots 102–109 in the exemplary embodiment extend within adhesive layer 100 from a region proximate to a side or corner of cavity hole 101 to a corresponding peripheral side or corner of adhesive layer 100.

Venting slots 102–109 serve as conduits for air and evaporated (gaseous) moisture within adhesive layer 100, which has been determined to cause the randomly occurring voids described above. Venting slots 102–109, approximately 1.5 mm wide in the exemplary embodiment, provide channels for conducting such moisture away from cavity region 101 towards the periphery of the package. The air and moisture vapor may be drawn out of the assembled package under the influence of a vacuum during the adhesive curing process and/or expelled by the heating required to reflow the solder balls during mounting of the packaged device in a system.

Accordingly, bridge portions 110 of the adhesive layer 100, located at the terminating ends of venting slots 102–109 at the periphery of adhesive layer 100 and separating the venting slots 102–109 from the ambient environment outside adhesive layer 100, are sufficiently narrow to permit diffusion of air and moisture vapor therethrough while providing structural support and integrity for adhesive layer 100.

In the example shown, venting slots 102–109 include extensions 111 around the periphery of cavity hole 101 and, in aggregate, extend substantially completely around cavity hole 101 to capture moisture diffusing out of adhesive layer 100 towards cavity hole 101. Portions 112 of adhesive layer 100 separating venting slots 102–109 are preferably wide enough to minimize diffusion of air or moisture vapor from venting slots 102–109 into cavity hole 101.

Figure 4:
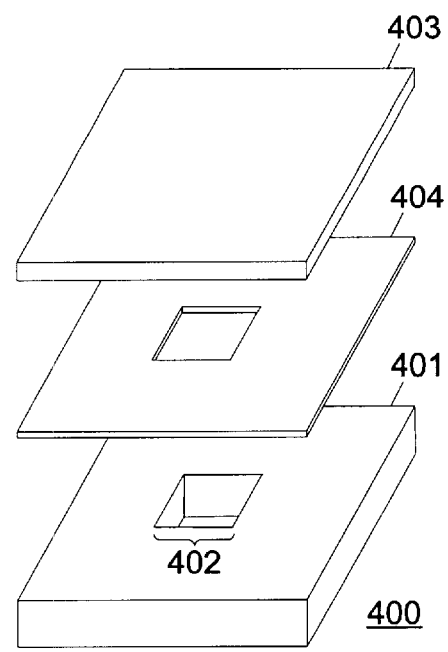
FIG. 4 depicts a portion of an integrated circuit package including a preformed adhesive layer which suffers from a high incidence of uncontrolled voids between the adhesive layer and adjoining components.

FIG. 2 is a plan view of a sheet of preformed integrated circuit packaging adhesive layers with venting slots according to one embodiment of the present invention. Adhesive layer 100 (which may optionally be made from essentially the same material as adhesive layer 404 depicted in FIG. 4, but patterned differently, as shown) may be produced in quantity by replicating the pattern of the cavity hole and venting slots for a number of individual layers several times within a single sheet, then either separating the individual layers (e.g., by laser cutting) or performing a mass lamination utilizing a large sheet of heat sink material and a panel of the substrates with the sheet of preformed integrated circuit packaging adhesive layers, singulating the individual packages after lamination by cutting (saw or laser).

FIG. 3 depicts a portion of an integrated circuit package including a preformed adhesive layer with venting slots according to one embodiment of the present invention. Integrated circuit package 300 includes a substrate 301 (e.g., a printed circuit board substrate) including a die cavity 302 extending therethrough. Substrate 301 is affixed to another package component 303 using a preformed adhesive layer 100 of the type described above. Package component 303 is a metallic heat spreader in the example shown, but alternatively may be another substrate layer or any other package component.

During assembly, the epoxy resin with which adhesive layer 100 is impregnated is cured to affix the substrate 301 to package component 303. An integrated circuit die is mounted within die cavity 302 and affixed, through cavity hole 101 within adhesive layer 100, to the surface of package component 303 using conventional methods such as resin, etc. Wire bonds are then formed connecting the integrated circuit die to conductive traces on substrate 301 which connect to solder balls within a ball grid array formed on substrate 301. The assembled package is mounted by reflowing the solder balls to form electrical connections between the package and the structure on which the package is being mounted.

Although the present invention has been described in detail, those skilled in the art will understand that various changes, substitutions and alterations herein may be made without departing from the spirit and scope of the invention it its broadest form.

What is claimed is:

1. For use in an integrated circuit package, an adhesive layer for affixing one package component to another package component comprising:

an adhesive material region; and at least one venting slot extending within the adhesive material region from a region proximate to a central region of said adhesive material region towards a side or corner of a periphery of said adhesive material region, the at least one venting slot for controlling a size and location of voids between said adhesive material region and components joined by said adhesive material region during packaging.

2. The adhesive layer as set forth in claim 1 wherein said at least one venting slot further comprises:

a plurality of venting slots each extending from a region proximate to a side or corner of a cavity hole within said adhesive material region towards a corresponding side or corner of said periphery of said adhesive material region.

3. The adhesive layer as set forth in claim 2 wherein each said venting slot is separated from said periphery of said adhesive material region by a width of adhesive material sufficiently narrow to permit diffusion of gas therethrough.

4. The adhesive layer as set forth in claim 3 wherein each said venting slot further comprises:

extensions extending along a periphery of said cavity hole.

5. The adhesive layer as set forth in claim 4 wherein said extensions are spaced from said cavity hole by adhesive material sufficiently wide to minimize diffusion of gas from said venting slots into said cavity hole.

6. The adhesive layer as set forth in claim 1 wherein said adhesive material region is formed of fiberglass impregnated with epoxy resin.

7. The adhesive layer as set forth in claim 1 wherein said adhesive material region is formed of polyimide film with B-staged polyimide adhesive resin.

8. The adhesive layer as set forth in claim 1 wherein said adhesive layer comprises a sheet forming a plurality of said adhesive material regions, each adhesive material region including said at least one venting slot.

9. An integrated circuit package comprising:

a first package component;

a second package component; and an adhesive layer affixing said first and second package components to each other, said adhesive layer comprising:

an adhesive material region; and at least one venting slot extending within the adhesive material region from a region proximate to a central region of said adhesive material region towards a side or corner of a periphery of said adhesive material region, the at least one venting slot for controlling a size and location of voids between said adhesive layer and said first or second component during packaging.

10. The integrated circuit package as set forth in claim 9 wherein said at least one venting slot further comprises:

a plurality of venting slots each extending from a region proximate to a side or corner of said cavity hole within said adhesive material region towards a corresponding side or corner of said periphery of said adhesive material region.

11. The integrated circuit package as set forth in claim 10 wherein each said venting slot is separated from said periphery of said adhesive material region by a width of adhesive material sufficiently narrow to permit diffusion of gas therethrough.

12. The integrated circuit package as set forth in claim 11 wherein each said venting slot further comprises:

extensions extending along a periphery of said cavity hole.

13. The integrated circuit package as set forth in claim 12, wherein said extensions are spaced from said cavity hole by adhesive material sufficiently wide to minimize diffusion of gas from said venting slots into said cavity hole.

14. The integrated circuit package as set forth in claim 9, wherein said adhesive material region is formed of fiberglass impregnated with epoxy resin.

15. The integrated circuit package as set forth in claim 9, wherein said adhesive material region is formed of polyimide film with B-staged polyimide adhesive resin.

16. The integrated circuit package as set forth in claim 9 further comprising:

an integrated circuit die mounted within a die cavity within said first package component and affixed through a cavity hole within said adhesive material region to said second package component.

* * * * *